United States Patent
Miks et al.

(10) Patent No.: US 7,485,952 B1
(45) Date of Patent: Feb. 3, 2009

(54) DROP RESISTANT BUMPERS FOR FULLY MOLDED MEMORY CARDS

(75) Inventors: Jeffrey A. Miks, Chandler, AZ (US); Jung Chun Shis, Hsinchu (TW)

(73) Assignee: Amkor Technology, Inc., Chandler, AZ (US)

( * ) Notice: Subject to any disclaimer, the term of this patent is extended or adjusted under 35 U.S.C. 154(b) by 887 days.

(21) Appl. No.: 10/607,324

(22) Filed: Jun. 26, 2003

Related U.S. Application Data

(63) Continuation-in-part of application No. 09/956,190, filed on Sep. 19, 2001, now Pat. No. 6,900,527.

(51) Int. Cl.
  *H01L 23/495* (2006.01)
  *H01L 23/48* (2006.01)
(52) U.S. Cl. .................... 257/673; 257/667; 257/670; 257/773; 257/775
(58) Field of Classification Search ................ 257/666, 257/667, 670, 673, 676, 773, 775
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |

(Continued)

FOREIGN PATENT DOCUMENTS

DE 19734794 A1 8/1997

(Continued)

*Primary Examiner*—Ori Nadav
(74) *Attorney, Agent, or Firm*—Stetina Brunda Garred & Brucker

(57) ABSTRACT

A memory card comprising a leadframe having a plurality of contacts, at least one die pad, and a plurality of conductive traces extending from respective ones of the contacts toward the die pad. Also included in the leadframe are at least two bumpers. Attached to the die pad is a semiconductor die which is electrically connected to at least one of the traces. A body defining at least two corner regions at least partially encapsulates the leadframe and the semiconductor die such that the contacts are exposed in a bottom surface defined by the body, and the bumpers are located at respective ones of the corner regions thereof.

9 Claims, 3 Drawing Sheets

U.S. PATENT DOCUMENTS

| | | |
|---|---|---|
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,394,607 A * | 3/1995 | Chiu et al. .................... 29/827 |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,789,280 A * | 8/1998 | Yokota ........................ 438/123 |
| 5,801,440 A | 9/1998 | Chu et al. |
| 5,808,359 A * | 9/1998 | Muto et al. .................. 257/712 |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |

| | | |
|---|---|---|
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Costantini et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,534,849 B1 | 3/2003 | Gang |
| 6,559,525 B2 | 5/2003 | Huang |
| 6,566,168 B2 | 5/2003 | Gang |
| 6,624,005 B1 | 9/2003 | DiCaprio et al. |
| 6,843,421 B2 * | 1/2005 | Chhor et al. ............ 235/492 |
| 2001/0008305 A1 | 7/2001 | McLellan et al. |
| 2001/0014538 A1 | 8/2001 | Kwan et al. |
| 2001/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0030131 A1 | 2/2003 | Lee et al. |
| 2003/0073265 A1 | 4/2003 | Hu et al. |

FOREIGN PATENT DOCUMENTS

| | | |
|---|---|---|
| EP | 5421117 | 6/1979 |
| EP | 5950939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 098968 | 3/2000 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63067762 | 3/1988 |
| JP | 63205935 | 8/1988 |

| | | | | | | |
|---|---|---|---|---|---|---|
| JP | 63233555 | 9/1988 | | JP | 8306853 | 11/1996 |
| JP | 63249345 | 10/1988 | | JP | 98205 | 1/1997 |
| JP | 63316470 | 12/1988 | | JP | 98206 | 1/1997 |
| JP | 64054749 | 3/1989 | | JP | 98207 | 1/1997 |
| JP | 1106456 | 4/1989 | | JP | 992775 | 4/1997 |
| JP | 1175250 | 7/1989 | | JP | 9293822 | 11/1997 |
| JP | 1205544 | 8/1989 | | JP | 10022447 | 1/1998 |
| JP | 1251747 | 10/1989 | | JP | 10163401 | 6/1998 |
| JP | 3177060 | 8/1991 | | JP | 10199934 | 7/1998 |
| JP | 4098864 | 9/1992 | | JP | 10256240 | 9/1998 |
| JP | 5129473 | 5/1993 | | JP | 00150765 | 5/2000 |
| JP | 5166992 | 7/1993 | | JP | 556398 | 10/2000 |
| JP | 5283460 | 10/1993 | | JP | 2001060648 | 3/2001 |
| JP | 692076 | 4/1994 | | JP | 200204397 | 8/2002 |
| JP | 6140563 | 5/1994 | | KR | 941979 | 1/1994 |
| JP | 6260532 | 9/1994 | | KR | 9772358 | 11/1997 |
| JP | 7297344 | 11/1995 | | KR | 100220154 | 6/1999 |
| JP | 7312405 | 11/1995 | | KR | 0049944 | 6/2002 |
| JP | 864634 | 3/1996 | | WO | 9956316 | 11/1999 |
| JP | 8083877 | 3/1996 | | WO | 9967821 | 12/1999 |
| JP | 8125066 | 5/1996 | | | | |
| JP | 8222682 | 8/1996 | | * cited by examiner | | |

DROP RESISTANT BUMPERS FOR FULLY MOLDED MEMORY CARDS

CROSS-REFERENCE TO RELATED APPLICATIONS

The present application is a continuation-in-part of U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001 now U.S. Pat. No. 6,900,527.

STATEMENT RE: FEDERALLY SPONSORED RESEARCH/DEVELOPMENT

Not Applicable

BACKGROUND OF THE INVENTION

The present invention relates generally to memory cards and, more particularly, to a memory card (e.g., a multi-media card (MMC)) comprising a leadframe which is provided with bumpers arranged to absorb any impact on the corners of the card to resist cracking or chip-out at the corners when the card is dropped onto a hard surface.

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Typically, memory cards comprise multiple integrated circuit devices or semiconductor dies. The dies are interconnected using a circuit board substrate which adds to the weight, thickness, stiffness and complexity of the card. Memory cards also include electrical contacts for providing an external interface to an insertion point or socket. These electrical contacts are typically disposed on the back side of the circuit board substrate, with the electrical connection to the dies being provided by vias which extend through the circuit board substrate.

In an effort to simplify the process steps needed to fabricate the memory card, there has been developed by Applicant a memory card wherein a leadframe assembly is used as an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, of which the present application is a continuation-in-part. As is described in Ser. No. 09/956,190, the leadframe and semiconductor die of the memory card are covered with an encapsulant which hardens into a cover or body of the memory card. The body is sized and configured to meet or achieve a "form factor" for the memory card. In the completed memory card, the contacts of the leadframe are exposed within a common surface of the body, with a die pad of the leadframe and the semiconductor die mounted thereto being disposed within or covered by the body.

Applicant has previously determined that the molding or encapsulation process used to form the body of the card sometimes gives rise to structural deficiencies or problems within the resultant memory card. These problems include portions of the die pad of the leadframe being exposed in the body of the memory card, flash being disposed on the contacts of the leadframe, chipping in a peripheral flange area of the body, and mold gate pull-out wherein a portion of the mold or encapsulating compound is pulled out from within the body, leaving a small recess or void therein. To address these particular problems, Applicant has previously developed a memory card having a "die down" configuration attributable to the structural attributes of the leadframe included therein, and an associated molding methodology employed in the fabrication of such memory card. This die-down memory card is disclosed in Applicant's co-pending U.S. application Ser. No. 10/266,329 entitled DIE DOWN MULTI-MEDIA CARD AND METHOD OF MAKING SAME filed Oct. 8, 2002, the disclosure of which is incorporated herein by reference.

In the electronics industry, memory cards such as multi-media cards are subject to an MMCA test requirement which requires that the card survive a 1.5 mm free fall drop test without incurring any damage. Memory cards as currently known in the art typically fail this MMCA standard drop test due to damage or chipping which occurs in the corner areas of the body thereof. The present invention addresses this particular shortcoming of memory cards by providing "bumpers" as a leadframe structure or feature which provide shock absorption to protect the corner areas of the body from damage at impact upon a hard surface such as a floor. These and other attributes of the present invention will be described in more detail below.

BRIEF SUMMARY OF THE INVENTION

In accordance with the present invention, there are provided various embodiments of a leadframe which are formed in a manner such that a memory card constructed through the use of the leadframe includes bumpers or bumper segments disposed in at least two of the corner regions defined by the card body. The bumpers or bumper segments are uniquely configured to provide shock absorption to protect the corner areas or regions of the body from damage at impact upon a hard surface such as a floor. As a result, the inclusion of the bumpers or bumper segments in the memory card in accordance with the present invention allows the memory card to meet various test requirements which require that the card survive a prescribed freefall drop without incurring any damage to the body thereof.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
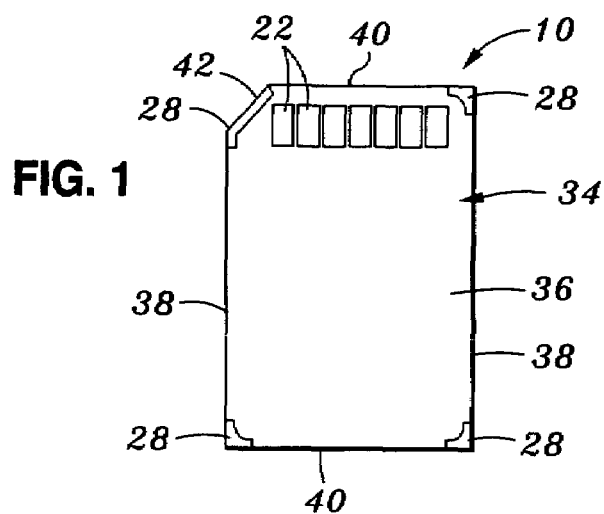
FIG. 1 is a bottom plan view of a memory card having a leadframe which is formed to include bumpers constructed in accordance with a first embodiment of the present invention.

Referring now to the drawings wherein the showings are for purposes of illustrating preferred embodiments of the present invention only, and not for purposes of limiting the same, FIG. 1 depicts a memory card 10 which includes a leadframe 12 (shown in FIGS. 2 and 3) constructed in accordance with a first embodiment of the present invention. The leadframe 12 is shown in a preliminary, unsingulated state in FIG. 2, and in its final, singulated state in FIG. 3. As shown in FIG. 1, the memory card 10 has a form factor particularly suited for use in a multi-media card memory application. However, those of ordinary skill in the art will recognize that the memory card 10 may have alternative memory card formats, including those of secure digital cards (SDC), compact flash (CF), memory stick, and other small form factor memory cards.

In its preliminary, unsingulated state, the leadframe 12 of the memory card 10 comprises an outer frame or dambar 14. The dambar 14 has a generally rectangular configuration defining an opposed pair of longitudinal sides or segments 16 and an opposed pair of lateral sides or segments 18. In addition to the dambar 14, the leadframe 12 includes a die attach area or die pad 20 which is disposed within the interior of the dambar 14. The die pad 20 defines opposed, generally planar top and bottom surfaces. Integrally connected to and extending from one lateral side 18 of the dambar 14 is a plurality of contacts 22 of the leadframe 12. Each of the contacts 22 also defines opposed, generally planar top and bottom surfaces. Integrally connected to and extending from each of the contacts 22 is a conductive trace 24. The traces 24 terminate in close proximity to the die pad 20. Tie bars 26 are used to integrally connect the die pad 20 to the longitudinal sides 16 of the dambar 14.

In addition to the above-described elements, the leadframe 12 includes bumpers 28 which are disposed within the interior of the dambar 14. More particularly, the bumpers 28 are integrally connected to the dambar 14 at respective ones of the four corner regions collectively defined by the longitudinal and lateral sides 16, 18 of the dambar 14. The particular configuration of each bumper 28 and possible variants thereof will be discussed in more detail below.

Figure 2:
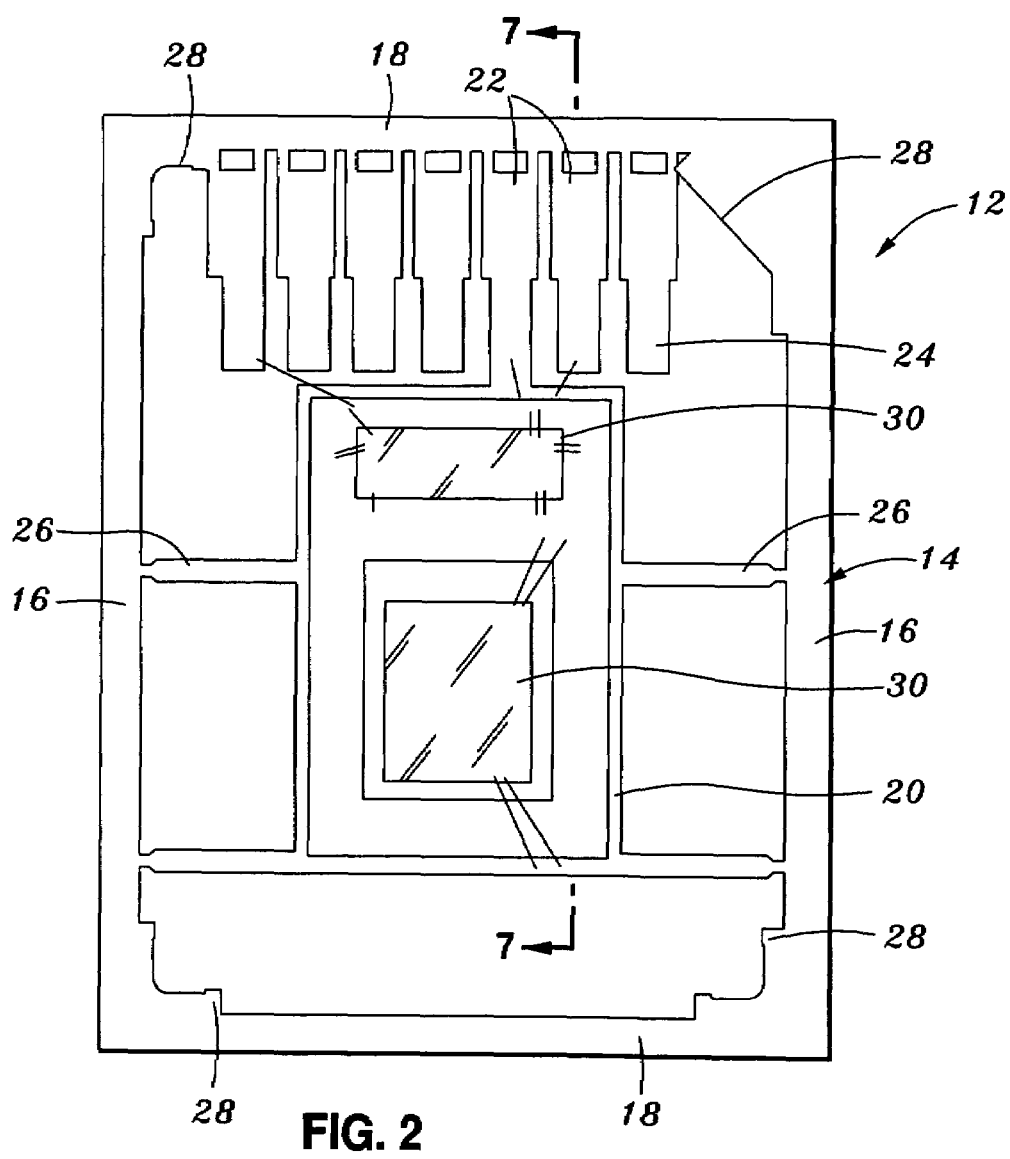
FIG. 2 is a top plan view of a leadframe formed to include the bumpers of the first embodiment, the leadframe being shown in a preliminary, unsingulated state.
Figure 3:
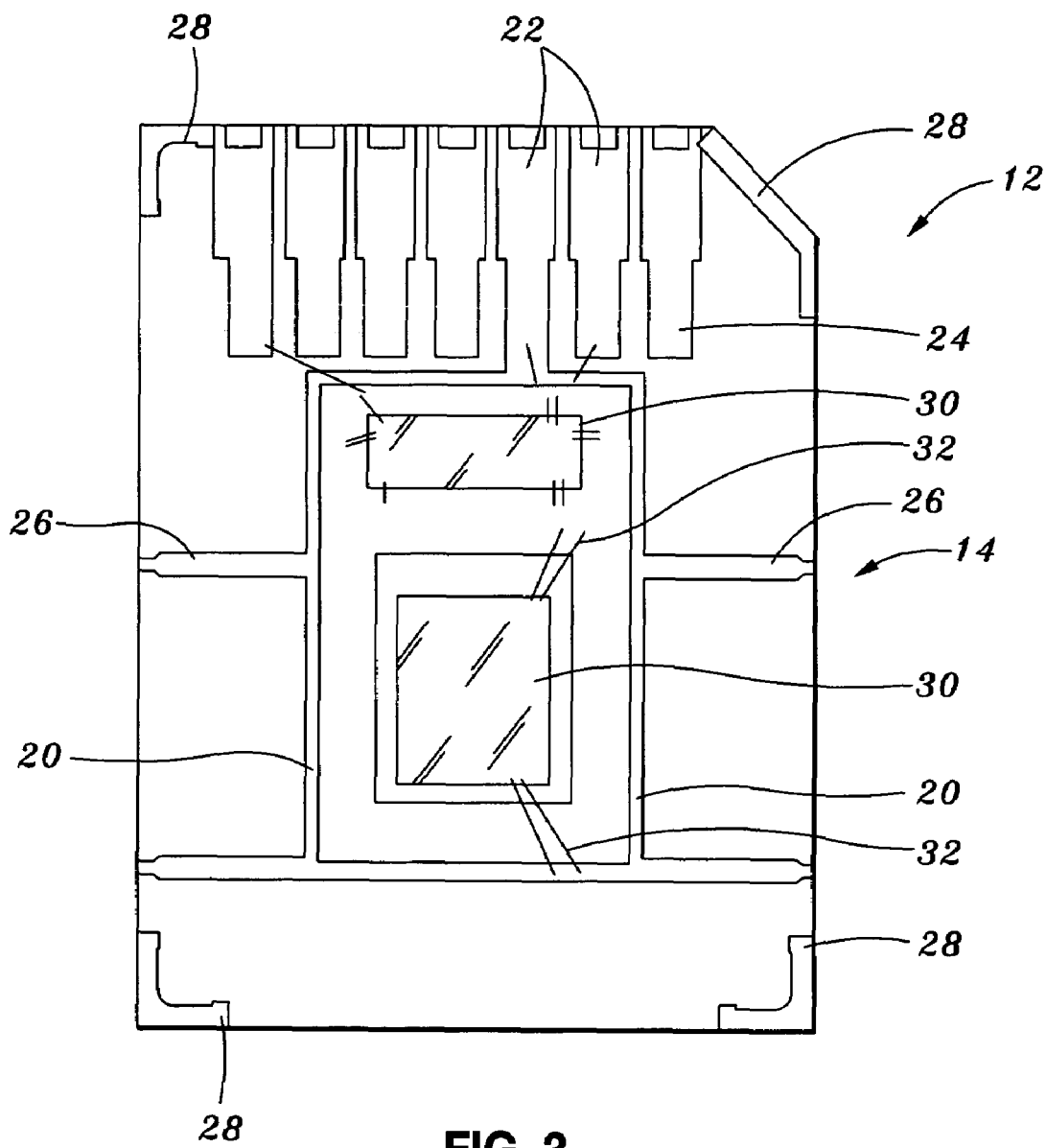
FIG. 3 is a top plan view of the leadframe shown in FIG. 2 in its final, singulated state.

In the memory card 10, attached to the top surface of the die pad 20 are multiple semiconductor dies 30. In FIGS. 2 and 3, a pair of semiconductor dies 30 is shown as being attached to the top surface of the die pad 20 in spaced relation to each other. The attachment of the semiconductor dies 30 to the die pad 20 is preferably facilitated through the use of an epoxy or adhesive. Subsequent to such attachment, the contacts or terminals disposed on the top surface of each semiconductor die 30 are electrically connected to one or more traces 24, the die pad 20, and/or each other through the use of conductive wires 32. In this regard, the conductive wires 32 effectively place the terminals of the semiconductor dies 30 into electrical communication with the leadframe 12 and, more particularly, to one or more of the contacts 22 thereof.

Those of ordinary skill in the art will recognize that the leadframe 12 may be formed to include any number of contacts 22 depending on the desired application for the memory card 10. Along these lines, the leadframe 12 may further be alternatively configured to define more than one die pad for accommodating fewer or greater numbers of semiconductor dies alone or in combination with other devices such as passive devices. In this regard, the two semiconductor dies 30 shown in FIGS. 2 and 3 may be substituted with one or more than two semiconductor dies alone or in combination with one or more other devices. Further, one or more than two semiconductor dies and/or one or more other devices can be attached to a single die pad, or to respective ones of multiple die pads. The pattern of the conductive traces 24 may also be varied depending upon the number and arrangement of die pads and the number of semiconductor dies and/or other passive devices included in the memory card 10. Thus, the configuration of the leadframe 12 as shown in FIGS. 2 and 3 is exemplary only, in that the number and arrangement of die pads, contacts, and conductive traces may be varied as needed to satisfy the requirements of a particular application.

Figure 7:
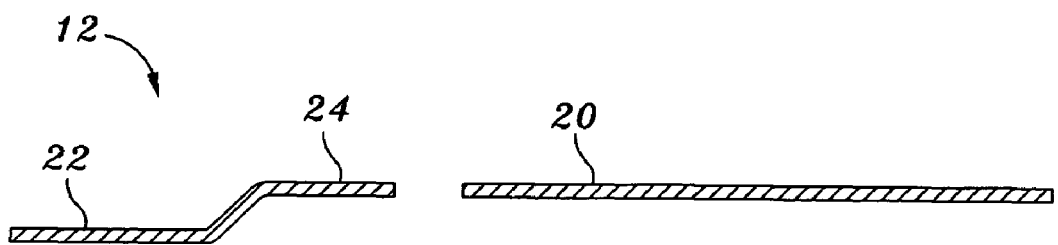
FIG. 7 is a partial cross-section view of the leadframe from FIG. 2 depicting a bend in a trace which is located between one of the contacts and the die pad of the leadframe.

Subsequent to the electrical connection of the semiconductor dies 30 to the leadframe 12 in the above-described manner, the leadframe 12 is preferably subjected to a bending operation wherein each of the traces 24 is bent so as to facilitate the creation of an angled or sloped portion therein which is located between the contacts 22 and the die pad 20. As shown in the partial cross-sectional view of the leadframe 12 presented in FIG. 7, the bending of the traces 24 removes the contacts 22 from their original co-planar relationship to the die pad 20. Thus, the contacts 22 and die pad 20 extend along respective ones of spaced, generally parallel planes. The bending of the leadframe 12 in the above-described manner may occur either prior to the attachment of the semiconductor dies 30 to the top surface of the die pad 20, or subsequent to the extension of the conductive wires 32 between the terminals of the semiconductor dies 30 and the traces 24.

Subsequent to the bending of the leadframe 12, an encapsulant material is applied to the leadframe 12, the semiconductor dies 30 and conductive wires 32. The encapsulant material is preferably a plastic (e.g., thermoset, thermoplastic) which, upon hardening, forms a body 34 of the memory card 10. The body 34 defines a generally planar top surface, and an opposed, generally planar bottom surface 36. In addition, the body 34 defines an opposed pair of longitudinal sides 38, an opposed pair of lateral sides 40, and a fifth sloped side 42 which extends angularly between one of the lateral sides 40 and one of the longitudinal sides 38. In the completed body 34, the bottom surfaces of the contacts 22 of the leadframe 12 are exposed in and generally flush with the bottom surface 36 of the body 34. The leadframe 12 is preferably fabricated from a conductive metal material (e.g., copper) through either a chemical etching or mechanical stamping process. It is contemplated that the die pad 20, contacts 22, and traces 24 of the leadframe 12 will be formed to have a thickness less than that of the surrounding dambar 14 and bumpers 28 by subjecting one or both sides of the formed leadframe 12 to a partial etching process. As a result, in addition to the bottom surfaces of the contacts 22 being exposed in the bottom surface 36 of the body 34, the opposed top and bottom surfaces of each of the bumpers 28 are also exposed in and substantially flush with respective ones of the top surface and bottom surface 36 of the body 34 as is seen in FIG. 1. The exposure of the top and bottom surfaces of each bumper 28 within the body 34 is attributable to the increased thickness of the bumpers 28 in comparison to those portions of the leadframe 12 which are covered by the body 34 (i.e., the die pad(s) 20, contacts 22 and traces 24).

Subsequent to the formation of the body 34, the leadframe 12 is cut or singulated in a manner facilitating the removal of the dambar 14 as is needed to electrically isolate the traces 24 and hence the contacts 22 from each other. In this regard, the body 34 is preferably formed on the leadframe 12 such that the dambar 14 remains exposed (i.e., is not covered by the body 34). The exposure of the dambar 14 allows for the removal of the same from the completely formed body 34. The body 34 is formed to provide a prescribed form factor for the memory card 10.

As seen in FIGS. 2 and 3, the bumpers 28 are defined in the completed memory card 10 as a result of the removal of the dambar 14 from the remainder of the leadframe 12. In the completed memory card 10, three of the bumpers 28 have a generally L-shaped configuration, and are located in respective ones of three complementary corner regions collectively defined by the longitudinal and lateral sides 38, 40 of the body 34. The remaining bumper 28 has a configuration differing from that of the other three L-shaped bumpers 28, and extends along the sloped side surface 42 of the body 34. Though the memory card 10 is shown in FIGS. 1 and 3 as including a total of four bumpers 28, those of ordinary skill in the art will recognize that alternative configurations are contemplated wherein less than four bumpers 28 are included in the memory card 10. For example, the bumper 28 located along the sloped side surface 42, may be omitted alone or in combination with the bumper 28 partially defined by the lateral side 40 disposed closest to the contacts 22. In such alternative configuration, the sole two bumpers 28 included in the memory card 10 would be located in respective ones of those corner regions partially defined by the lateral side 40 of the body 34 disclosed furthest from the contacts 22. Additionally, though not shown, it is contemplated that in the memory card 10, the semiconductor die(s) 30 may be attached to the bottom surface of the die pad 30 as opposed to the top surface thereof as shown in FIGS. 2 and 3. This alternative configuration is commonly referred to as a die down or deep down-set configuration. The attachment of the semiconductor die(s) to either the top or bottom surfaces of the die pad 20 does not alter the structural or functional attributes of the bumpers 28 located within one or more of the corner regions defined by the body 34 of the memory card 10. As indicated above, the bumper(s) 28 of the memory card 10 effectively protect the corner areas or regions of the body 34 from damage at impact upon a hard surface such as a floor. Thus, the bumper(s) 28 help the memory card 10 in achieving compliance with various test requirements such as the above-described MMCA test requirement requiring that the memory card 10 survive a 1.5 mm freefall drop test without incurring any damage.

Figure 4:
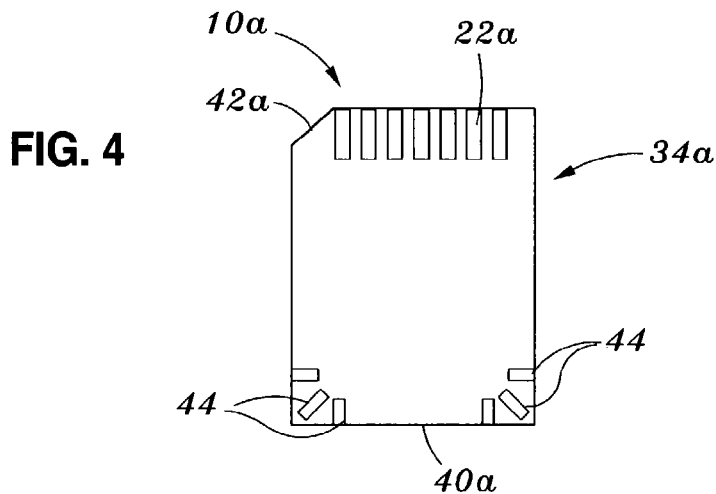
FIG. 4 is a bottom plan view of a memory card having a leadframe which is formed to include bumpers constructed in accordance with a second embodiment of the present invention.

Referring now to FIG. 4, there is shown a bottom plan view of a memory card 10a constructed in accordance with a second embodiment of the present invention. The memory card 10a is substantially similar to the above-described memory card 10, except that the leadframe of the memory card 10a is formed such that when the dambar is removed therefrom, two sets of bumper segments 44 are included at respective ones of a pair of corner regions of the body 34a of the memory card 10a which are partially defined by the lateral side 40a which is disposed furthest from the contacts 22a. However, it will be recognized that in the memory card 10a, the bumper segments 44 may also be included at the remaining corner region of the body 34a and/or along the sloped side 42a thereof, in the manner shown in relation to the bumpers 28 of the memory card 10.

Figure 5A:
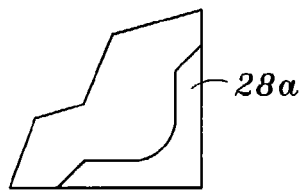
FIGS. 5A-5G are partial plan views of corner regions of memory cards having leadframes which are formed to include variations of the bumpers of the first and second embodiments shown in FIGS. 1 and 4.
Figure 5B:
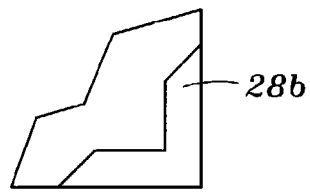
Figure 5C:
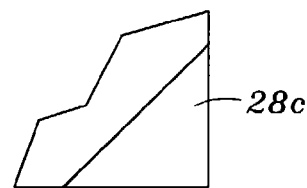
Figure 5D:
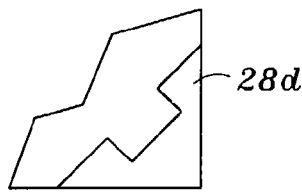
Figure 5E:
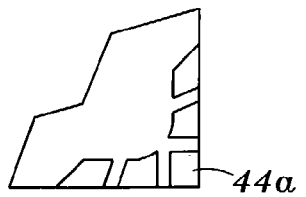
Figure 5F:
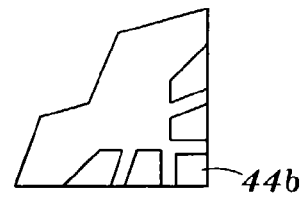
Figure 5G:
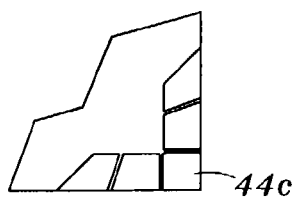

FIGS. 5A-5D depict alternatively configured bumpers 28a, 28b, 28c, 28d, respectively, which each may be used as an alternative to the bumpers 28 shown and described in relation to FIGS. 1-3. FIGS. 5E-5G depict sets of bumper segments 44a, 44b, 44c, respectively, which may be used as an alternative to the bumper segments 44 shown in FIG. 4. Those of ordinary skill in the art will recognize that the bumpers 28 and bumper segments 44 shown in FIGS. 1 and 4 and the structural variations thereof shown in FIGS. 5A-5G may be used in any number and in any combination within the memory card 10, 10a.

Figure 6:
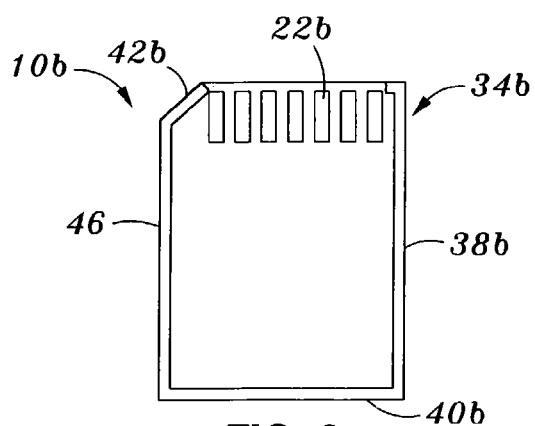
FIG. 6 is a bottom plan view of memory card having a leadframe which is formed to include bumpers constructed in accordance with a third embodiment of the present invention.

Referring now to FIG. 6, there is shown a bottom plan view of a memory card 10b constructed in accordance with a third embodiment of the present invention. The memory card 10b is similar to the memory card 10, except that the leadframe of the memory card 10b is formed such that the removal of the dambar therefrom facilitates the creation of a continuous bumper 46. As seen in FIG. 6, the bumper strip 46 extends along both longitudinal sides 38b of the body 34b, the lateral side 40b which is disposed furthest from the contacts 22b, and the sloped side 42b. The bumper 46 also extends along a small section of the remaining lateral side 40b, terminating at approximately that contact 22b disposed furthest from the sloped side 42b. Though not shown, as an alternative to being formed as a continuous strip, the bumper 46 may comprise a series of bumper segments similar to those shown in FIGS. 4 and 5E-5G.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A memory card comprising:
   a plurality of contacts;
   at least one die pad defining opposed top and bottom surfaces;
   a plurality of conductive traces extending from respective ones of the contacts toward the die pad; and
   at least two bumpers;
   at least one semiconductor die attached to the die pad and electrically connected to at least one of the traces; and
   a body defining at least two corner regions and at least partially encapsulating the contacts, the die pad, the bumpers and the semiconductor die such that the contacts are exposed in a bottom surface defined by the body and the bumpers are located at respective ones of the corner regions of the body but do not protrude therefrom.

2. The memory card of claim 1 wherein the traces are bent in a manner such that the die pad and the contacts extend along respective ones of spaced, generally parallel frame planes.

3. The memory card of claim 2 wherein the semiconductor die is attached to the bottom surface of the die pad so as to extend along a die plane which is disposed between and generally parallel to the frame planes.

4. The memory card of claim 2 wherein the semiconductor die is attached to the top surface of the die pad.

5. The memory card of claim 1 wherein:
   the body defines an opposed pair of longitudinal sides, an opposed pair of lateral sides, and a sloped side which extends angularly between one of the lateral sides and one of the longitudinal sides;
   the contacts extend along one of the lateral sides of the body; and
   the at least two bumpers are located at respective ones of a pair of the corner regions which are partially defined by the lateral side of the body opposite that including the contacts extending there along.

6. The memory card of claim 5 wherein each of the bumpers comprises a plurality of bumper segments.

7. The memory card of claim 5 wherein four of the bumpers are located at respective ones of the sloped side and three of the corner regions collectively defined by the longitudinal and lateral sides of the body.

8. The memory card of claim 7 wherein each of the bumpers comprises a plurality of bumper segments.

9. The memory card of claim 1 wherein:
each of the bumpers defines opposed, generally planar top and bottom surfaces;
the body defines opposed, generally planar top and bottom surfaces; and
the top and bottom surfaces of the bumpers are exposed in and substantially flush with respective ones of the top and bottom surfaces of the body.

* * * * *